United States Patent
Kao et al.

[11] Patent Number: 6,125,859
[45] Date of Patent: Oct. 3, 2000

[54] METHOD FOR IMPROVED CLEANING OF SUBSTRATE PROCESSING SYSTEMS

[75] Inventors: Chien-Teh Kao, Sunnyvale; Karl Anthony Littau, Palo Alto; Anand Vasudev, San Jose, all of Calif.; Dong Won Koo, Rahway, N.J.

[73] Assignee: Applied Materials, Inc., Santa Clara, Calif.

[21] Appl. No.: 08/893,922

[22] Filed: Jul. 11, 1997

Related U.S. Application Data

[63] Continuation of application No. 08/811,627, Mar. 5, 1997.
[51] Int. Cl.$^7$ .................................................. H01L 21/00
[52] U.S. Cl. .......................... 134/1.1; 216/69; 438/905; 156/345
[58] Field of Search ........................... 158/345; 438/905; 134/1.1; 216/67, 69

[56] References Cited

U.S. PATENT DOCUMENTS

| | | | |
|---|---|---|---|
| 5,158,644 | 10/1992 | Cheung et al. | 156/643 |
| 5,211,796 | 5/1993 | Hansen | 156/345 |
| 5,401,358 | 3/1995 | Kadomura | 156/651 |
| 5,413,670 | 5/1995 | Langan et al. | 134/1.2 |
| 5,454,903 | 10/1995 | Redeker et al. | 216/67 |
| 5,474,615 | 12/1995 | Ishida et al. | 134/1.2 |
| 5,491,172 | 2/1996 | Buchta et al. | 437/225 |
| 5,503,676 | 4/1996 | Shufflebotham et al. | 118/723 MR |
| 5,611,863 | 3/1997 | Miyagi | 118/723 MP |
| 5,616,208 | 4/1997 | Lee | 156/345 |

FOREIGN PATENT DOCUMENTS

| | | |
|---|---|---|
| 0343038A1 | 11/1989 | European Pat. Off. . |
| 4132561A1 | 4/1993 | European Pat. Off. . |
| 63-48832 | 3/1988 | Japan . |
| 1-102921 | 4/1989 | Japan . |
| 4-165075 | 6/1992 | Japan . |
| 5-90180 | 4/1993 | Japan . |
| 6-318580 | 11/1994 | Japan . |
| 8-31752 | 2/1996 | Japan . |
| 8-85885 | 4/1996 | Japan . |

*Primary Examiner*—Thi Dang
*Attorney, Agent, or Firm*—Townsend and Townsend and Crew

[57] ABSTRACT

A method for a multiple-stage microwave plasma cleaning technique for efficiently cleaning a substrate processing chamber. In a specific embodiment, a two-stage cleaning process is described. The first stage begins by flowing a reactive gas from a gas source into a processing chamber where microwaves ignite and maintain a plasma from the reactive gas. Reactive radicals generated which react with residues on the interior surfaces of the processing chamber. In the second stage, an inert gas is flowed into the processing chamber in addition to the reactive gas. Microwaves then ignite and maintain a plasma from the reactive gas and optionally, the inert gas as well. Optionally, an inert gas can be flowed into the processing chamber prior to the first stage to remove loose particles from the processing chamber. The reactive gas in such embodiments is preferably $NF_3$, but other fluorine-containing gases such as carbon tetrafluoride ($CF_4$) or sulfur hexafluoride ($SF_6$) may also be used. Moreover, chlorine- or other halogen-containing gases may also be used as the reactive gas in other embodiments in place of fluorine-containing gases.

25 Claims, 7 Drawing Sheets

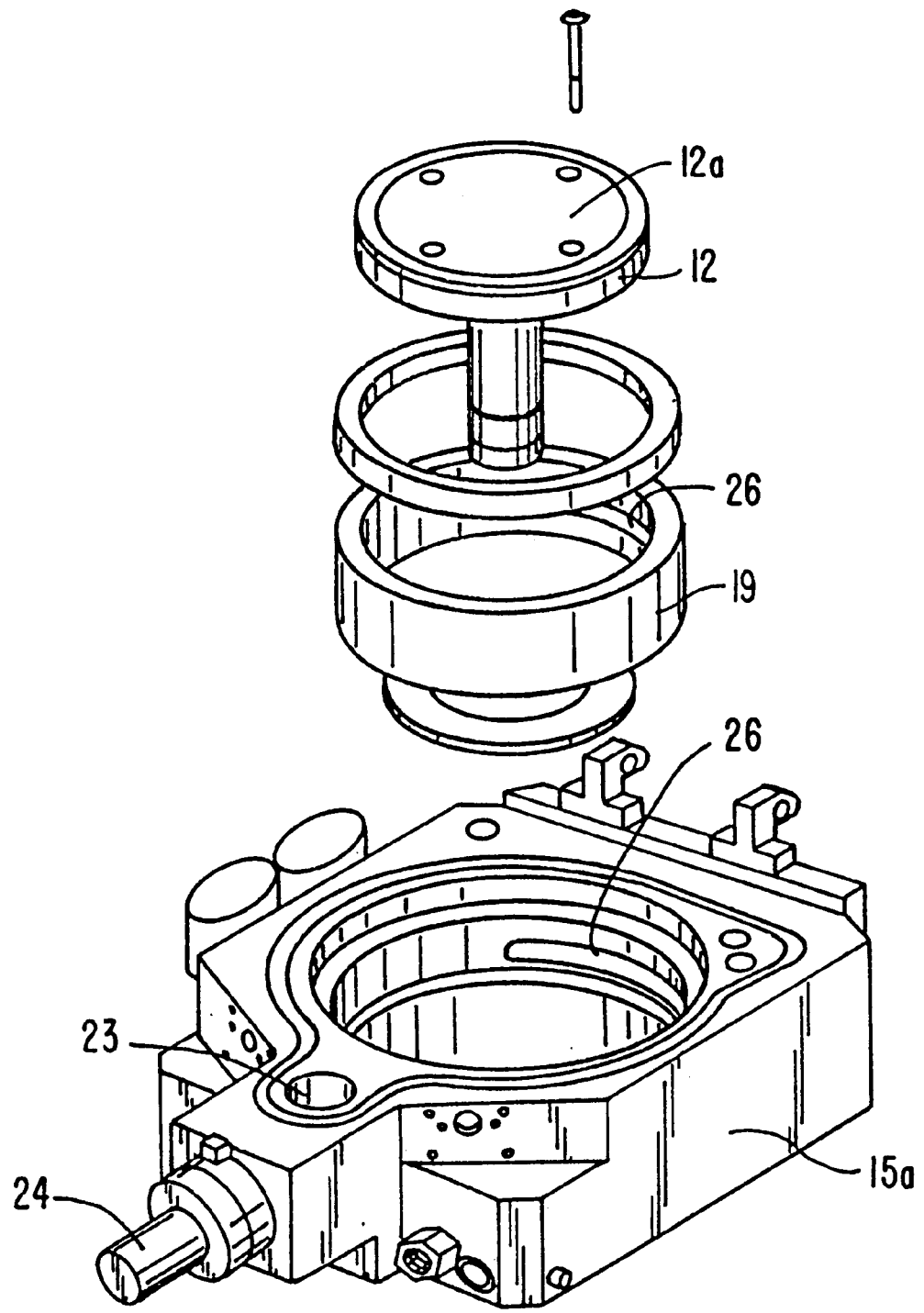
FIG. IC.

METHOD FOR IMPROVED CLEANING OF SUBSTRATE PROCESSING SYSTEMS

CROSS REFERENCE TO RELATED APPLICATIONS

This application is related to commonly assigned patent applications entitled "APPARATUS AND METHODS FOR UPGRADED SUBSTRATE PROCESSING SYSTEM WITH MICROWAVE PLASMA SOURCE", filed on Mar. 5, 1997 as application Ser. No. 08/811,627, and having Tsutomu Tanaka, Mukul Kelkar, Kevin Fairbairn, Hari Ponnekanti and David Cheung listed as inventors; "APPARATUS FOR IMPROVED REMOTE MICROWAVE PLASMA SOURCE FOR USE WITH SUBSTRATE PROCESSING SYSTEMS", filed on Apr. 23, 1997 as application Ser. No. [AMAT1975/T19000], and having Chien-Teh Kao, Kenneth Tsai, Quyen Pham, Ronald L. Rose, Calvin R. Augason, and Joseph Yudovsky listed as inventors (referred to herein as "Kao"); and "REMOTE PLASMA CLEANING SOURCE HAVING REDUCED REACTIVITY WITH A SUBSTRATE PROCESSING CHAMBER" filed concurrently herewith as application Ser. No. [AMAT2119/T21300], and having Anand Vasudev, Chiliang Chen, and Karl Littau listed as inventors; the disclosures of which are hereby incorporated by reference.

BACKGROUND OF THE INVENTION

The present invention relates to substrate processing. More specifically, the present invention relates to an apparatus and method for the cleaning of a substrate processing system's processing chamber.

One of the primary steps in the fabrication of modern semiconductor devices is the formation of a layer, such as a metal silicide layer like tungsten silicide ($WSi_x$), on a substrate. As is well known, such a layer can be deposited by chemical vapor deposition (CVD). In a conventional thermal CVD process, reactive gases are supplied to the substrate surface where heat-induced chemical reactions take place to form the desired film over the surface of the substrate being processed. In a conventional plasma-enhanced CVD (PECVD) process, a controlled plasma is formed using radio frequency (RF) energy or microwave energy to decompose and/or energize reactive species in reactant gases to produce the desired film.

One problem that arises during such CVD processes is that unwanted deposition occurs on some or all of the processing chamber's interior surfaces, leading to potentially high maintenance costs. With CVD of a desired film onto a substrate, the deposition of undesired residues can occur on any surface including the heater and process kit parts of the apparatus, because the reactive gases can diffuse to most parts of the processing chamber, even between cracks and around corners. During subsequent substrate depositions, these residues can accelerate until a continuous metal silicide film is grown on the heater and/or these other parts. Over time, failure to clean the residue from the CVD apparatus often degrades process yield. When excess deposition starts to interfere with the CVD system's performance, the heater and other process kit parts (such as the shadow ring and gas distribution faceplate) can be replaced to remove unwanted accumulations thereon. Depending on which and how many parts need replacing and the frequency of the replacement, the cost of maintaining the substrate processing system can become very high. Moreover, such maintenance adversely affects throughput of the CVD system.

In these CVD processes, cleaning of the processing chamber is regularly performed to remove such unwanted residues from the chamber walls, heater, and other process kit parts. Commonly performed between deposition steps for every substrate (or every n substrates), in situ cleaning procedures using one or more cleaning (i.e., etchant) gases are performed to remove the unwanted residual material accumulated during the deposition process. Common cleaning techniques include thermal, RF plasma, and microwave plasma techniques that promote dissociation of the reactant gases to generate highly reactive species (such as halogen radicals (highly reactive, single halogen atoms)), and are often referred to as "dry" cleaning techniques. In these techniques, the halogen radicals react with and etch away the unwanted residues from the chamber walls and other surfaces. However, the etching gases useful for cleaning the chamber are often corrosive and can attack not only the residues being removed, but also the materials which make up the chamber, heater, and process kit components. This is particularly true for certain cleaning gases used in conjunction with metal CVD processes.

Such is the case for thermal processes using chlorine trifluoride ($ClF_3$). In such an in situ thermal cleaning process, $ClF_3$ is flowed into the processing chamber being cleaned. Thermal energy (i.e., heat) is then applied to the $ClF_3$ to generate fluorine radicals (i.e., single fluorine atoms, denoted F*). When cleaning a processing chamber in which a tungsten silicide ($WSi_x$) deposition process has been performed, these fluorine radicals combine with the tungsten (W) and silicon (Si) residues to form tungsten fluoride ($WF_y$) and silicon fluoride ($SiF_z$), which, being volatile products, can then be exhausted from the processing chamber.

The advantages provided by a thermal process using $ClF_3$ include the need for few modifications to the substrate processing system to take advantage of such a technique. Because the $ClF_3$ is easily dissociated, a simple thermal method is all that is required to generate the required fluorine radicals, rather than the more-complex RF plasma-based cleaning techniques. Moreover, a thermal technique causes minimal damage to the process kit. However, this technique also has certain disadvantages. Certain of the gases generated as by-products of this process (e.g., chlorine and fluorine) are highly corrosive and environmentally undesirable. Thus, complex exhaust hardware is required to abate these dangerous gases. Due to their corrosive nature, frequent maintenance of the exhaust system is required, as is the replacement of critical elements of such an exhaust system. This adds to the cost of producing and maintaining such a system, and can adversely affect system up-time (i.e., throughput).

A second alternative for in situ cleaning of processing chambers is the use of an RF plasma. An RF plasma cleaning process could use nitrogen trifluoride ($NF_3$), for example, because such a technique is capable of imparting the high energies required to dissociate a more stable compound such as $NF_3$. First, $NF_3$ is flowed into the processing chamber being cleaned. RF energy is then applied (e.g., via the substrate processing system's capacitively-coupled electrodes), thus generating the fluorine radicals (F*) which remove the unwanted residues from the processing chamber's components. A frequency of 13.56 megahertz (MHz) is commonly used to excite the plasma. As above, when cleaning a processing chamber in which a tungsten silicide deposition process has been performed, the fluorine radicals combine with the tungsten and silicon residues to form tungsten fluoride and silicon fluoride, which, being volatile products, can then be exhausted from the processing chamber.

This technique is well-known, and so is well-understood. However, this technique also has certain disadvantages. In contrast to the thermal technique discussed above, an RF plasma process using $NF_3$ reduces both environmental and maintainability concerns, although fluorine-containing by-products are still generated by such a technique. Although $ClF_3$ (or compounds having similar dissociation energies) could be used in such an RF plasma cleaning process, the aforementioned problems related to the use of $ClF_3$ would again be encountered.

Chief among these disadvantages is the damage done to the process kit's components by such a cleaning technique. RF plasma cleaning causes ion bombardment of the metallic processing chamber components, causing physical damage to components such as the interior chamber walls. Therefore, such in situ cleaning may make it difficult to effectively clean residues without also eventually damaging the heater and other chamber components. Thus, maintaining chamber performance may result in damage to expensive consumable items, resulting in the need for frequent replacement. Also, inert gases such as argon (Ar) are often added in order to enhance the striking of the RF plasma. Because such elements often have greater atomic masses (i.e., are larger and heavier) than the constituent elements in the cleaning gas (e.g., N and F), the presence of such inert gases in the RF plasma can exacerbate the ion bombardment problem. The physical damage caused by ion bombardment also presents the possibility of particle generation. Other concerns are the sensitivity of such techniques to the timing of the cleaning process and the fact that areas not in contact with the plasma may not be properly cleaned.

Another alternative is the use of microwave frequencies to create the requisite plasma and dissociate the cleaning gas. In a microwave plasma technique, the plasma is struck by applying microwave energy to a cleaning gas such as $NF_3$, thus generating fluorine radicals. These radicals clean the interior of the processing chamber, as before. A microwave frequency of 2450 MHz is commonly used to excite the plasma. Advantages of such a technique include compatibility with pre-existing RF plasma cleaning systems and the highly efficient generation of halogen radicals. The high breakdown efficiency provided by a microwave plasma technique (at least 50%, but more likely on the order of about 99%) results in a higher etch rate (on the order of about 2 $\mu$m/min in the case of tungsten silicide residues) than is obtained with a capacitive RF plasma (which has a relatively low breakdown efficiency of between about 15% and 30%). This translates into faster and more thorough cleaning of the processing chamber's interior surfaces. Also, given the high percentage of fluorine converted into fluorine radicals (and their subsequent reaction with residues), the amount of fluorine produced by such systems is reduced, lessening concerns over the corrosive nature of the exhaust gases and attendant environmental effects. Some substrate systems must be modified significantly to employ such a technique. The problem of ion bombardment may also be encountered with such techniques.

As an alternative to an in situ microwave plasma cleaning technique, a separate microwave plasma system may be attached to the substrate processing system. As with the in situ microwave plasma technique, the high breakdown efficiency of a microwave plasma technique results in a high etch rate, providing the aforementioned benefits. However, unlike their in situ counterparts, remote microwave plasma generation systems provide radicals without subjecting the processing chamber's components to a plasma of any sort during cleaning operations. A remote microwave plasma cleaning technique can therefore more gently, efficiently, and adequately clean residues within the processing chamber without the physical damage to the gas distribution manifold, the inside chamber walls, and other processing chamber components that may be experienced with in situ techniques. Present systems can be easily modified to take advantage of such remote microwave plasma techniques because such microwave plasma systems are fairly self-contained.

One common problem the aforementioned cleaning techniques encounter is the differences in cleaning (etching) rates experienced by the various interior surfaces of the processing chamber being cleaned. As noted, in either some surfaces being over-etched, or a failure to remove the residues from others. A primary source of this disparity is variation in the surface temperature of the processing chamber components being cleaned. As is well known, the hotter the material, the faster that material will etch, all other chamber parameters remaining constant. Certain substrate processing systems (referred to herein as "hot-walled" systems) maintain the processing chamber's interior surfaces at a constant temperature by liquid heating (or cooling) of certain processing chamber components, most notably the chamber's walls. In such systems, cleaning operations tend to proceed more evenly from one surface to another because the etch rates remain fairly constant between the various surfaces of the processing chamber. In systems which provide no such control over surface temperatures (referred to herein as "cold-walled" systems), etch rates can differ significantly, with residues accumulated on hot surfaces (e.g., heated substrate pedestals) etching quickly and those accumulated on cold surfaces (e.g., chamber walls) etching more slowly. This results in either the incomplete cleaning of the cold surfaces or over-etching of the hot surfaces.

Because of problems related to the incomplete cleaning of certain processing chamber components, and the fact that few processing chamber components can be cleaned completely without causing unacceptable damage to other processing chamber components, additional cleaning procedures must be performed. Such procedures (often referred to as a "wet" cleaning) involve opening the processing chamber and physically wiping the entire processing chamber—including the chamber walls, exhaust and other areas having accumulated residue—with a special cloth and cleaning fluids, and so is carried out less frequently than in situ cleaning processes. Without frequent cleaning procedures (both in situ and wet cleanings), impurities from the residues in the CVD apparatus can migrate onto the substrate and cause device damage.

It can therefore be seen that the proper cleaning of a CVD system is essential to the reliable operation of the substrate processing system, and maintaining acceptable device yield and system throughput. Thus, given the foregoing, a microwave plasma cleaning system that permits the efficient cleaning of a processing chamber is desirable. It is also desirable to provide efficient generation of reactive radicals, while minimizing damage to the processing chamber's components that are exposed to the cleaning process. A cleaning technique which reduces the frequency with which wet cleaning operations must be performed is also desirable. Finally, such a cleaning technique should clean the processing chamber's interior surfaces evenly, regardless of whether a hot-walled or cold-walled system is being cleaned.

SUMMARY OF THE INVENTION

The present invention provides a method and apparatus for use with a substrate processing system. An apparatus according to the present invention provides a microwave-generated plasma that may be used to provide efficient cleaning of the substrate processing system.

To allow finer control of the cleaning process and to account for variations in residue accumulation, the method of the present invention cleans a substrate processing chamber's interior surfaces using multiple cleaning cycles, or stages. During each cleaning stage, halogen radicals and, optionally, one or more inert gases are introduced into the processing chamber. The method of the present invention uses a microwave plasma, generated either in situ or remotely, to generate the halogen radicals, which then react with residues accumulated on the processing chamber's interior surfaces. The by-products of these reactions are then exhausted from the processing chamber. The use of multiple cleaning stages, one or more of which include an inert gas, permits the etch (cleaning) rate to be separately adjusted for each cleaning stage. This is done to permit the removal of any residues remaining after the preceding cleaning stages, while minimizing over-etching of the processing chamber's interior surfaces.

According to one aspect of the method of the present invention, a method for removing residue from an interior surface of a substrate processing chamber is provided. This is done by performing two or more cleaning stages, each of which includes several steps. A cleaning stage begins by generating reactive halogen radicals. These reactive halogen radicals are generated by dissociating a halogen-containing gas using microwave energy. A gaseous cleaning mixture is then formed by mixing the reactive halogen radicals with an inert gas in a mixing ratio. The mixing ratio will normally be changed from one cleaning stage to the next, and will be changed at least once during the process. For example, if the mixing ratio is equal to a first mixing ratio during one cleaning stage, it will be equal to a second mixing ratio during another cleaning stage (the first and the second mixing ratios being different). Next a portion of the reactive halogen radicals is reacted with a portion of a residue accumulated on an interior surface of the substrate processing chamber to remove the portion of the residue. A second cleaning stage is then performed. Additional cleaning stages may also be performed subsequent to the second cleaning stage.

These and other embodiments of the present invention, as well as its advantages and features are described in more detail in conjunction with the text below and attached figures.

BRIEF DESCRIPTION OF THE DRAWINGS

FIGS. 1C and 1D are exploded perspective views of parts of the CVD system depicted in FIG. 1A;

DESCRIPTION OF THE PREFERRED EMBODIMENT

I. Introduction

To allow finer control of the cleaning process and to account for variations in residue accumulation, the method of the present invention cleans a substrate processing chamber's interior surfaces using multiple cleaning cycles, or stages. During each cleaning stage, halogen radicals and, optionally, one or more inert gases are introduced into the processing chamber. The method of the present invention uses a microwave plasma, generated either in situ or remotely, to generate the halogen radicals, which then react with residues accumulated on the processing chamber's interior surfaces. The by-products of these reactions are then exhausted from the processing chamber. The use of multiple cleaning stages, one or more of which include an inert gas, permits the etch (cleaning) rate to be separately adjusted for each cleaning stage. This is done to permit the removal of any residues remaining after the preceding cleaning stages, while minimizing over-etching of the processing chamber's interior surfaces.

The ability to separately adjust the etch rate of each cleaning stage also maximizes throughput by allowing increasingly finer control over the etch rate, while minimizing over-etching. For example, the first cleaning stage of the present invention could begin with a high etch rate, which quickly removes a large amount of residue from the processing chamber. Subsequent stages could employ lower etch rates, which would provide finer control over the amount of material etched away (at a time when little residue remained and the risk of over-etching was greatest).

In this way, the present invention quickly removes the majority of accumulated residues, with each successive level of remaining residue being removed as quickly as possible, while minimizing over-etching of processing chamber components. System throughput is thus maximized without sacrificing processing chamber component reliability, further minimizing downtime and increasing throughput. Alternatively, the cleaning stages may be rearranged, such that certain surfaces are "pre-etched," removing excess residue and enabling a subsequent cleaning stage to use undiluted halogen radicals to quickly remove the now-even layer of residue from the entire processing chamber interior. The multi-stage cleaning process of the present invention uniformly cleans the processing chamber's interior surfaces as quickly as possible, while minimizing over-etching of processing chamber components. This results in improved device yield and throughput, and reduces the frequency with which wet cleaning operations must be performed.

II. Exemplary CVD System

Figure 1A:
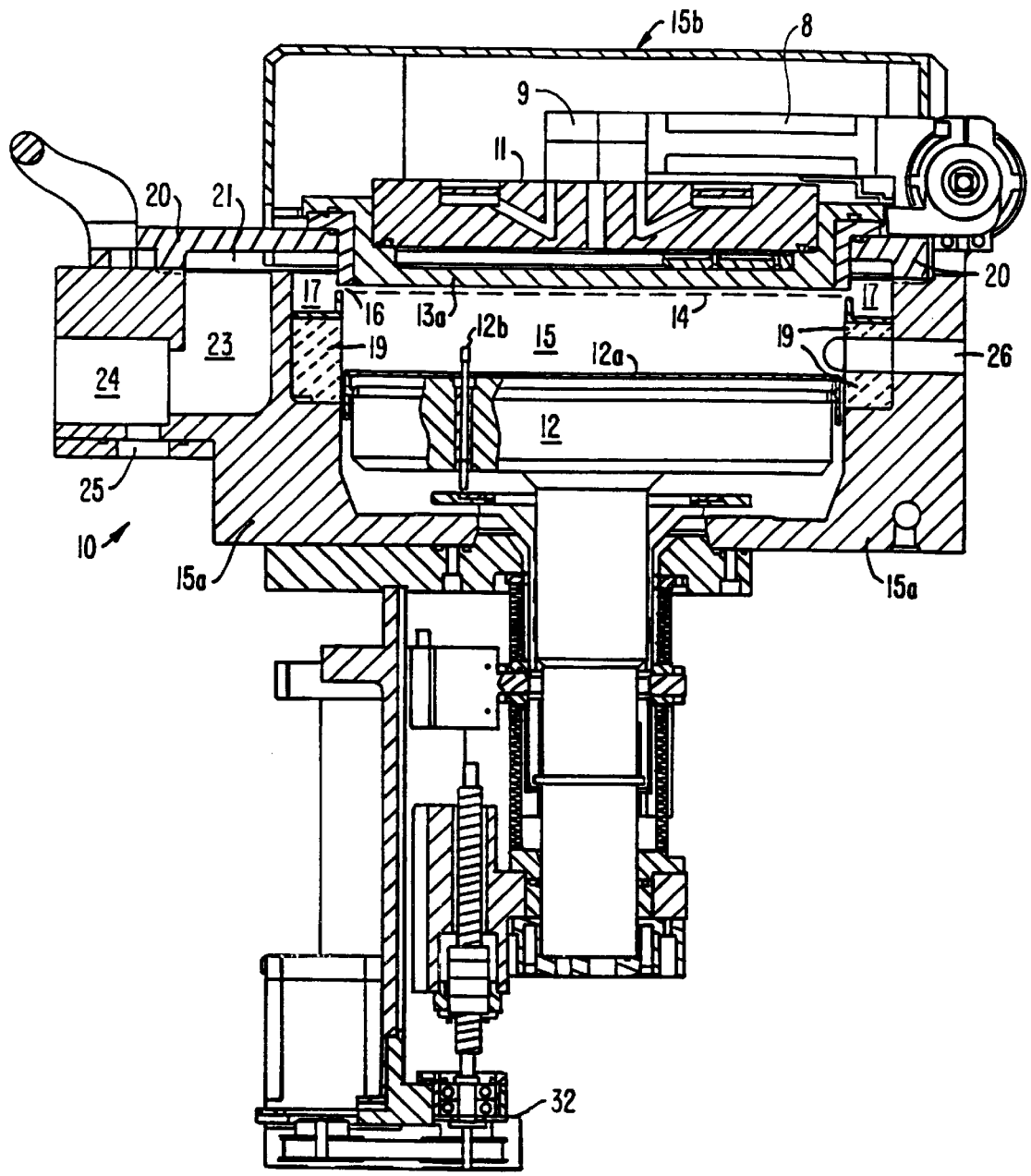
FIGS. 1A and 1B are vertical, cross-sectional views of one embodiment of an exemplary substrate processing system which may be used in accordance with the present invention.
Figure 1B:
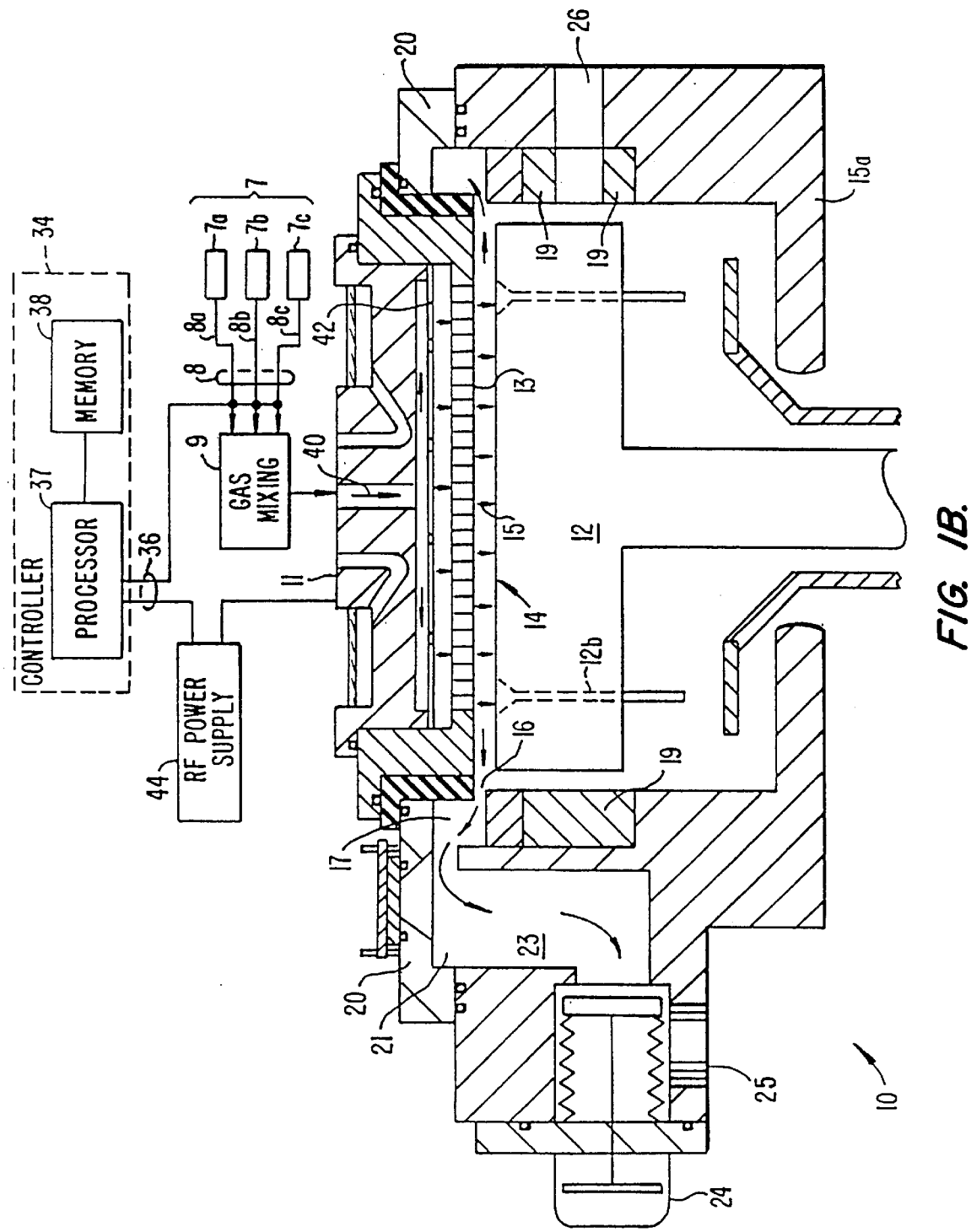
Figure 1D:
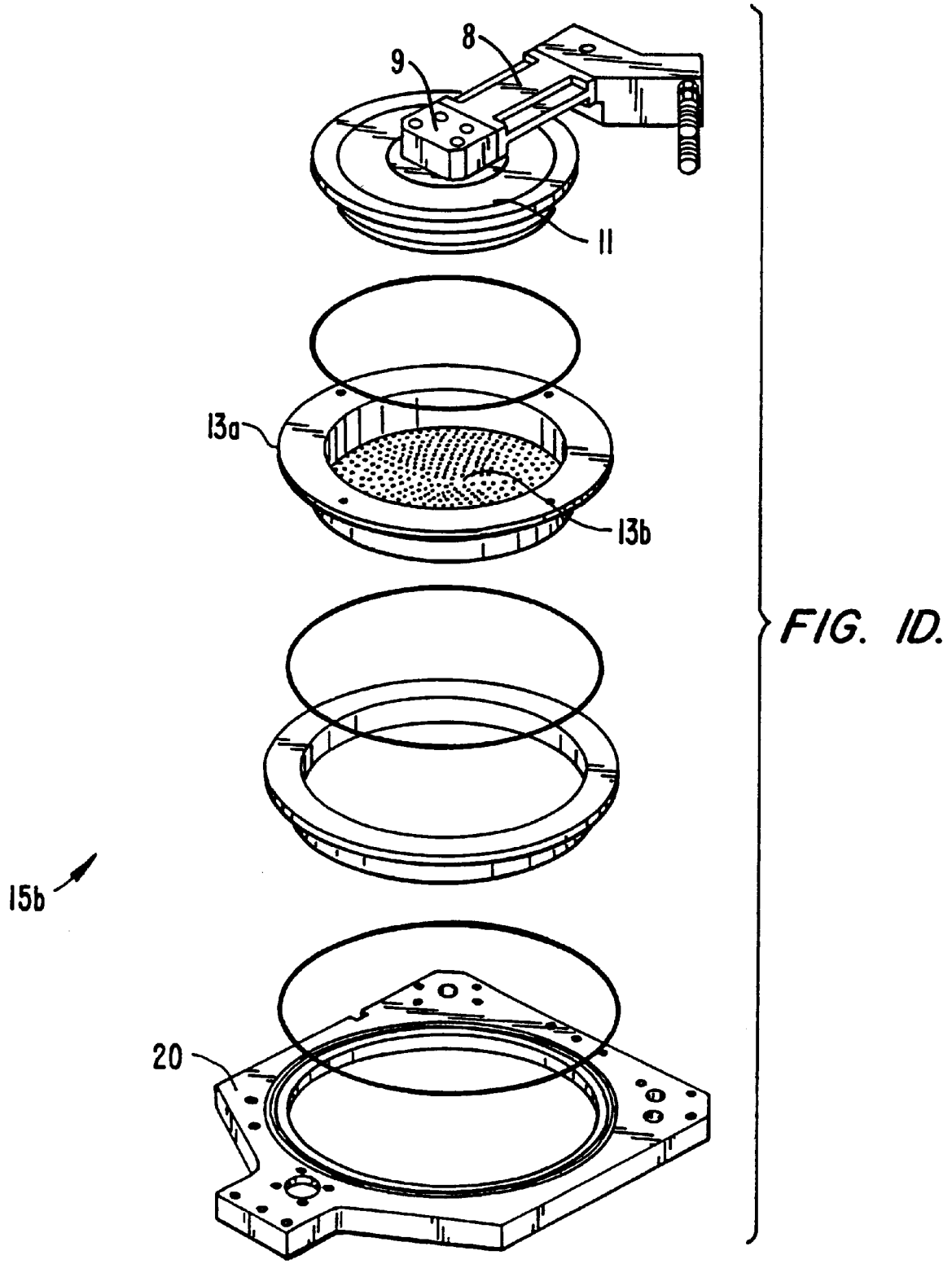

Specific embodiments of the present invention may be used with a variety of chemical vapor deposition (CVD) or other types of substrate processing system. One suitable substrate processing system in which the method of the present invention may be practiced is shown in FIGS. 1A and 1B, which are vertical, cross-sectional views of a CVD system 10, having a vacuum or processing chamber 15 that includes a chamber wall 15a and chamber lid assembly 15b. Chamber wall 15a and chamber lid assembly 15b are shown in exploded, perspective views in FIGS. 1C and 1D.

CVD system 10 contains a gas distribution manifold 11 for dispersing process gases to a substrate (not shown) that rests on a resistively-heated pedestal 12 centered within the process chamber. During processing, the substrate (e.g., a semiconductor substrate) is positioned on a flat (or slightly convex) surface 12a of pedestal 12. Preferably having a surface of ceramic such as aluminum nitride, pedestal 12 can be moved controllably between a lower loading/off-loading position (depicted in FIG. 1A) and an upper processing position (indicated by dashed line 14 in FIG. 1A and shown in FIG. 1B), which is closely adjacent to manifold 11. A centerboard (not shown) includes sensors for providing information on the position of the substrates. Deposition and carrier gases flow into chamber 15 through perforated holes 13b (FIG. 1D) of a conventional flat, circular gas distribution face plate 13a. More specifically, deposition process gases flow (indicated by arrow 40 in FIG. 1B) into the chamber through the inlet manifold 11, through a conventional perforated blocker plate 42 and then through holes 13b in gas distribution faceplate 13a.

Before reaching the manifold, deposition and carrier gases are input from gas sources 7 through gas supply lines 8 (FIG. 1B) into a gas mixing block or system 9 where they are combined and then sent to manifold 11. It is also possible, and desirable in some instances, to direct deposition and carrier gases directly from supply lines 8 to manifold 11. In such a case, gas mixing system 9 is bypassed. In other situations, any of gas lines 8 may bypass gas mixing system 9 and introduce gases through passages (not shown) in the bottom of chamber 12. As shown in FIG. 1B, there are three gas supply lines 8 in a specific embodiment to deposit $WSi_x$. A first line 8a supplies a silicon-containing gas (e.g., dichlorosilane ($SiH_2Cl_2$), referred to herein as "DCS") from a gas source 7a to gas mixing system 9, while a second line 8b supplies a tungsten-containing gas (e.g., tungsten hexafluoride ($WF_6$)) from a gas source 7b to gas mixing system 9. For each line 8a and 8b, a carrier gas (e.g., argon (Ar)) from gas sources 7a and 7b can be supplied with the process to stabilize gas flows as appropriate and to even the gas flow between the two lines into mixing system 9. Such mixing of gases (e.g., DCS and $WF_6$) upstream of chamber 15 is believed to result in more uniform gas distribution into the chamber, thereby resulting in greater uniformity in the deposited WSix film. A third supply line 8c flows an inert purge gas (e.g., argon) from a gas source 7c from the bottom of the chamber to keep deposition gases away from the area of the chamber below pedestal 12. In some preferred embodiments, an additional silicon source (e.g., silane ($SiH_4$)) from source 7a may be supplied to gas line 8a.

Generally, the supply line for each process gas includes (i) several safety shut-off valves (not shown) that can be used to automatically or manually shut off the flow of process gas into the chamber, and (ii) mass flow controllers (MFCs) (also not shown) that measure the flow of gas through the supply line. When toxic gases are used in the process, the several safety shut-off valves are positioned on each gas supply line in conventional configurations.

The deposition process performed in CVD system 10 can be either a thermal process or a plasma-enhanced process. In a plasma-enhanced process, an RF power supply 44 applies electrical power between the gas distribution faceplate 13a and pedestal 12 to excite the process gas mixture to form a plasma within the cylindrical region between the faceplate 13a and pedestal 12. (This region will be referred to herein as the "reaction region"). Constituents of the plasma react to deposit a desired film on the surface of the semiconductor substrate supported on pedestal 12. RF power supply 44 can be a mixed frequency RF power supply that typically supplies power at a high RF frequency (RF1) of 13.56 MHz and at a low RF frequency (RF2) of 360 kilohertz (kHz) to enhance the decomposition of reactive species introduced into the vacuum chamber 15. Of course, RF power supply 44 can supply either single- or mixed-frequency RF power (or other desired variations) to manifold 11 to enhance the decomposition of reactive species introduced into chamber 15. In a thermal process, RF power supply 44 is not utilized, and the process gas mixture thermally reacts to deposit the desired film on the surface of the semiconductor substrate supported on pedestal 12, which is resistively heated to provide the thermal energy needed for the reaction.

During a thermal deposition process, pedestal 12 is heated, causing heating of CVD system 10. In a hot-wall system, of the type previously mentioned, a hot liquid may be circulated through chamber wall 15a to maintain chamber wall 15a at an elevated temperature when the plasma is not turned on, or during a thermal deposition process. Fluids used to heat chamber wall 15a include the typical fluid types, i.e., water-based ethylene glycol or oil-based thermal transfer fluids. This heating beneficially reduces or eliminates condensation of undesirable reactant products and improves the elimination of volatile products of the process gases and contaminants that might otherwise condense on the walls of cool vacuum passages and migrate back into the processing chamber during periods of no gas flow. In a cold-wall system, chamber wall 15a is not heated. This might be done, for example, during a plasma-enhanced deposition process. In such a process, the plasma heats chamber 15, including chamber wall 15a surrounding exhaust passageway 23 and shut-off valve 24. However, because the plasma is unlikely to be in equal proximity to all chamber surfaces, variations in surface temperature may occur, as previously noted.

The remainder of the gas mixture that is not deposited in a layer, including reaction products, is evacuated from the chamber by a vacuum pump (not shown). Specifically, the gases are exhausted through an annular slot 16 surrounding the reaction region and into an annular exhaust plenum 17. Annular slot 16 and plenum 17 are defined by the gap between the top of chamber wall 15a (including upper dielectric lining 19) and the bottom of circular chamber lid 20. The 360° circular symmetry and uniformity of annular slot 16 and plenum 17 are important to achieving a uniform flow of process gases over the substrate so as to deposit a uniform film on the substrate. The gases flow underneath a lateral extension portion 21 of exhaust plenum 17, past a viewing port (not shown), through a downward-extending gas passage 23, past a vacuum shut-off valve 24 (whose body is integrated with a lower portion of chamber wall 15a), and into an exhaust outlet 25 that connects to the external vacuum pump through a foreline (not shown).

The substrate support platter of resistively-heated pedestal 12 is heated using an embedded single-loop embedded heater element configured to make two full turns in the form of concentric circles. An outer portion of the heater element runs adjacent to a perimeter of the support platter, while an inner portion runs on the path of a concentric circle having a smaller radius. The wiring to the heater element passes through the stem of pedestal 12. Pedestal 12 may be made of material including aluminum, ceramic, or some combination thereof.

Typically, any or all of the chamber lining, gas inlet manifold faceplate, and various other processing chamber hardware are made out of material such as aluminum, anodized aluminum, or a ceramic material. An example of such CVD apparatus is described in commonly assigned U.S. Pat. No. 5,558,717 entitled "CVD Processing Chamber," issued to Zhao et al., hereby incorporated by reference in its entirety.

A lift mechanism and motor 32 (FIG. 1A) raises and lowers pedestal 12 and its substrate lift pins 12b as substrates are transferred by a robot blade (not shown) into and out of the body of the chamber through an insertion/removal opening 26 in the side of chamber 10. Motor 32 raises and lowers pedestal 12 between a processing position 14 and a lower substrate-loading position. Motor 32, various valves and MFCs of the gas delivery system, and other components of CVD system 10 are controlled by a system controller 34 (FIG. 1B) over control lines 36, of which only some are shown. Controller 34 relies on feedback from optical sensors to determine the position of movable mechanical assemblies such as the throttle valve and pedestal which are moved by appropriate motors controlled by controller 34.

In a preferred embodiment, system controller 34 includes a hard disk drive (a memory 38), a floppy disk drive (not shown), and a processor 37. Processor 37 contains a single-board computer (SBC), analog and digital input/output boards, interface boards, and stepper motor controller boards. Various parts of CVD system 10 conform to the Versa Modular European (VME) standard which defines board, card cage, and connector dimensions and types. The VME standard also defines the bus structure as having a 16-bit data bus and a 24-bit address bus.

System controller 34 controls all of the activities of CVD system 10. System controller 34 executes system control software, which is a computer program stored in a computer-readable medium such as memory 38. Preferably, memory 38 is a hard disk drive, but memory 38 may also be other kinds of memory. The computer program includes sets of instructions that dictate the timing, mixture of gases, chamber pressure, chamber temperature, RF power levels, pedestal position, and other parameters of a particular process. Other computer programs stored on other memory devices including, for example, the floppy disk or other another appropriate drive, may also be used to operate system controller 34.

Figure 1E:
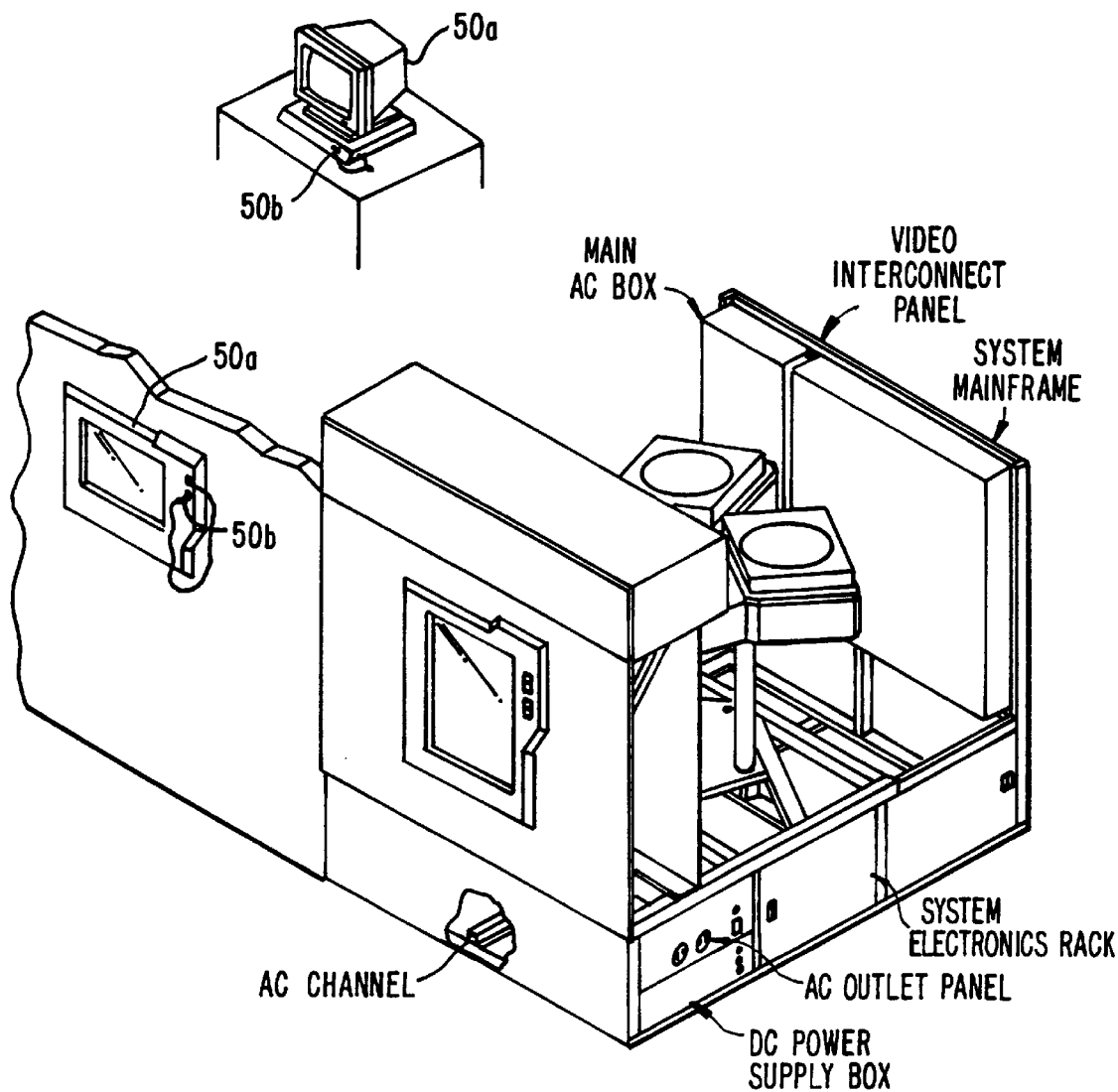
FIG. 1E is a simplified diagram of a system monitor and a CVD system in a system which may include one or more chambers.

The interface between a user and controller 34 is via a CRT monitor 50a and light pen 50b, shown in FIG. 1E, which is a simplified diagram of the system monitor and CVD system 10 in a substrate processing system, which may include one or more chambers. In the preferred embodiment two monitors 50a are used, one mounted in the clean room wall for the operators and the other behind the wall for the service technicians. CRT monitors 50a simultaneously display the same information, but only one light pen 50b is enabled. A light sensor in the tip of light pen 50b detects light emitted by CRT monitor 50a. To select a particular screen or function, the operator touches a designated area of the display screen and pushes the button on pen 50b. The touched area changes its highlighted color, or a new menu or screen is displayed, confirming communication between the light pen and the display screen. Other devices, such as a keyboard, mouse, or other pointing or communication device, may be used instead of or in addition to light pen 50b to allow the user to communicate with system controller 34.

The process for depositing the film can be implemented using a computer program product that is executed by system controller 34. The computer program code can be written in any conventional computer readable programming language: for example, 68000 assembly language, C, C++, Pascal, Fortran or others. Suitable program code is entered into a single file, or multiple files, using a conventional text editor and stored or embodied in a computer-usable medium, such as a memory system of the computer. If the entered code text is in a high level language, the code is compiled, and the resultant compiler code is then linked with an object code of precompiled Windows library routines. To execute the linked, compiled object code the system user invokes the object code, causing the computer system to load the code in memory. The CPU then reads and executes the code to perform the tasks identified in the program.

Figure 1F:
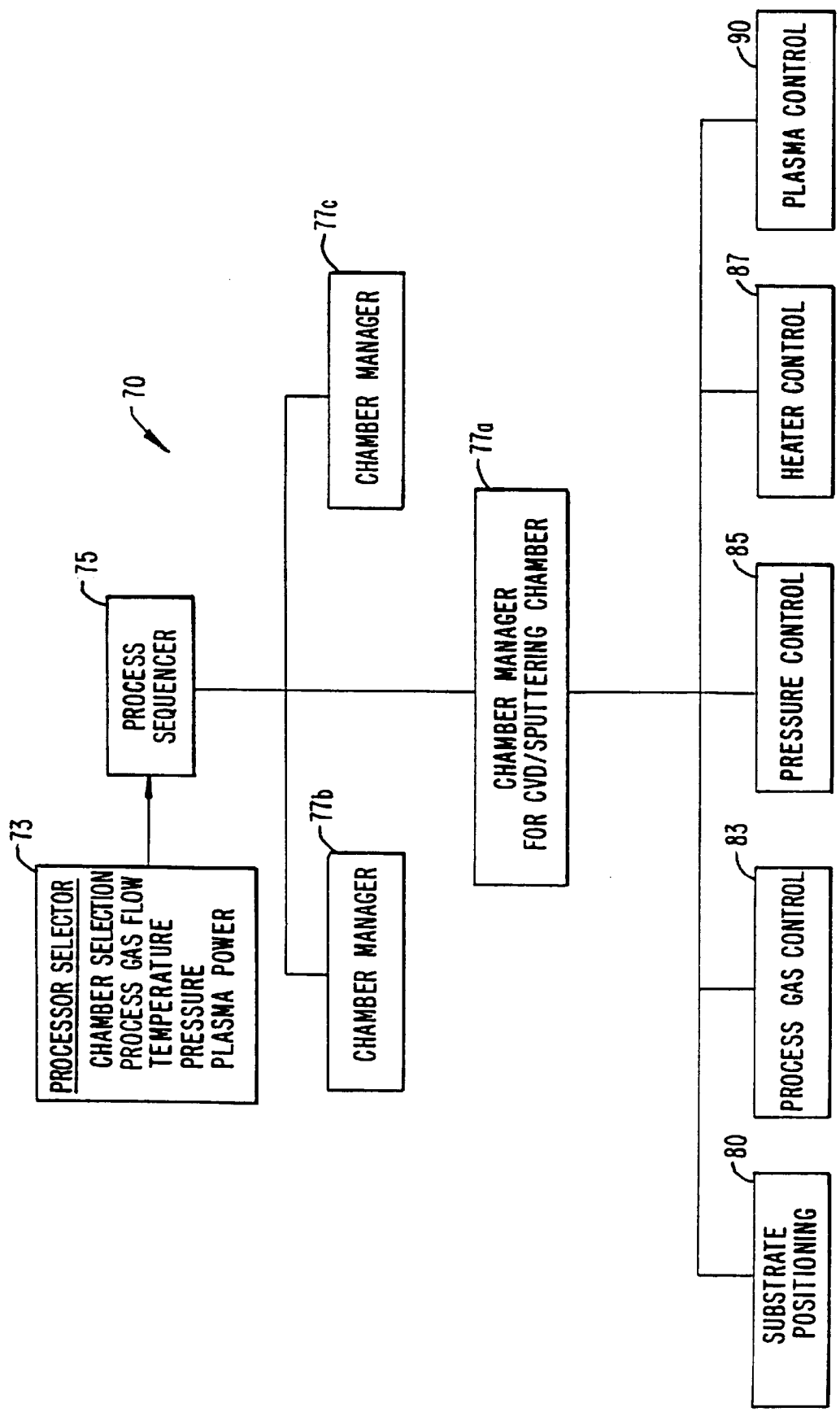
FIG. 1F shows an illustrative block diagram of the hierarchical control structure of the system control software according to a specific embodiment.

FIG. 1F is an illustrative block diagram of the hierarchical control structure of the system control software, a computer program 70, according to a specific embodiment. Using the light pen interface, a user enters a process set number and process chamber number into a process selector subroutine 73 in response to menus or screens displayed on CRT monitor 50a. The process sets are predetermined sets of process parameters necessary to carry out specified processes, and are identified by predefined set numbers. Process selector subroutine 73 identifies (i) the desired process chamber and (ii) the desired set of process parameters needed to operate the process chamber for performing the desired process. The process parameters for performing a specific process relate to process conditions such as, for example, process gas composition and flow rates, temperature, pressure, plasma conditions such as microwave power levels or RF power levels and the low frequency RF frequency, cooling gas pressure, and chamber wall temperature. These parameters are provided to the user in the form of a recipe and are entered utilizing the light pen/CRT monitor interface. The signals for monitoring the process are provided by the analog and digital input boards of the system controller, and the signals for controlling the process are output on the analog and digital output boards of CVD system 10.

A process sequencer subroutine 75 comprises program code for accepting the identified process chamber and set of process parameters from process selector subroutine 73 and for controlling operation of the various process chambers. Multiple users can enter process set numbers and process chamber numbers, or a user can enter multiple process set numbers and process chamber number, so process sequencer subroutine 75 operates to schedule the selected processes in the desired sequence. Preferably, process sequencer subroutine 75 includes code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, process sequencer subroutine 75 takes into consideration the present condition of the process chamber being used in comparison with the desired process conditions for a selected process, or the "age" of each particular user entered request, or any other relevant factor a system programmer desires to include for determining scheduling priorities.

Once it determines which process chamber and process set combination is to be executed, process sequencer subroutine 75 initiates execution of the process set by passing the particular process set parameters to chamber manager subroutines 77a–c, which control multiple processing tasks in process chamber 15 according to the process set determined by process sequencer subroutine 75. For example, chamber manager subroutine 77a comprises program code for controlling sputtering and CVD process operations in process chamber 15. Chamber manager subroutines 77a–c also control execution of various chamber component subroutines that control operation of the chamber components necessary to carry out the selected process set. Examples of chamber component subroutines are a substrate positioning subroutine 80, a process gas control subroutine 83, a pressure control subroutine 85, a heater control subroutine 87, and a plasma control subroutine 90. Those having ordinary skill in the art will readily recognize that other chamber control subroutines can be included depending on what processes are to be performed in process chamber 15.

In operation, chamber manager subroutine 77a selectively schedules or calls the process component subroutines in accordance with the particular process set being executed. Chamber manager subroutine 77a schedules the process component subroutines much like process sequencer subroutine 75 schedules the process set to be executed and the chamber in which to execute it. Typically, chamber manager subroutine 77a includes steps of monitoring the various chamber components, determining which components need to be operated based on the process parameters for the process set to be executed, and causing execution of a chamber component subroutine responsive to the monitoring and determining steps.

Operation of particular chamber component subroutines will now be described with reference to FIG. 1F. Substrate positioning subroutine 80 comprises program code for controlling chamber components that are used to load the substrate onto pedestal 12, to lift the substrate to a desired height in process chamber 15, and to control the spacing between the substrate and gas distribution manifold 11. When a substrate is loaded into process chamber 15, pedestal 12 is lowered to receive the substrate, and thereafter, pedestal 12 is raised to the desired height in process chamber 15, to maintain the substrate at a desired distance or spacing from gas distribution manifold 11 during processing. In operation, substrate positioning subroutine 80 controls movement of pedestal 12 in response to process set parameters, related to the support height, that are transferred from chamber manager subroutine 77a.

Process gas control subroutine 83 has program code for controlling process gas composition and flow rates. Process gas control subroutine 83 controls the open/close position of the safety shut-off valves, and also ramps up/down the mass flow controllers to obtain the desired gas flow rate. Process gas control subroutine 83 is invoked by chamber manager subroutine 77a, as are all chamber component subroutines, and receives from the chamber manager subroutine process parameters related to the desired gas flow rates. Typically, process gas control subroutine 83 operates by opening the gas supply lines and repeatedly (i) reading the necessary mass flow controllers, (ii) comparing the readings to the desired flow rates received from chamber manager subroutine 77a, and (iii) adjusting the flow rates of the gas supply lines as necessary. Furthermore, process gas control subroutine 83 includes steps for monitoring the gas flow rates for unsafe rates and for activating the safety shut-off valves when an unsafe condition is detected.

In some processes, an inert gas such as helium or argon is flowed into process chamber 15 to stabilize the pressure in the chamber before reactive process gases are introduced. For these processes, process gas control subroutine 83 is programmed to include steps for flowing the inert gas into chamber 15 for an amount of time necessary to stabilize the pressure in chamber 15, and then the above-described steps performed. Additionally, if a process gas is to be vaporized from a liquid precursor (e.g., tetraethylorthosilicate ("TEOS")), process gas control subroutine 83 is written to include steps for bubbling a delivery gas, such as helium, through the liquid precursor in a bubbler assembly or introducing a carrier gas, such as helium or nitrogen, into a liquid injection system. When a bubbler is used for this type of process, process gas control subroutine 83 regulates the flow of the delivery gas, the pressure in the bubbler, and the bubbler temperature in order to obtain the desired process gas flow rates. As discussed above, the desired process gas flow rates are transferred to process gas control subroutine 83 as process parameters. Furthermore, process gas control subroutine 83 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure, and bubbler temperature are monitored, compared to the necessary values and adjusted accordingly.

Pressure control subroutine 85 comprises program code for controlling the pressure in processing chamber 15 by regulating the size of the opening of the throttle valve in the chamber's exhaust system. The size of the throttle valve's opening is set to control the chamber pressure to the desired level in relation to the total process gas flow, size of process chamber 15, and pumping set-point pressure for the exhaust system. When pressure control subroutine 85 is invoked, the target pressure level is received as a parameter from chamber manager subroutine 77a. Pressure control subroutine 85 operates to measure the pressure in processing chamber 15 by reading one or more conventional pressure manometers connected to the chamber, to compare the measured value(s) to the target pressure, to obtain PID (proportional, integral, and differential) values from a stored pressure table corresponding to the target pressure, and to adjust the throttle valve according to the PID values obtained from the pressure table. Alternatively, pressure control subroutine 85 can be written to open or close the throttle valve to a particular opening size to regulate processing chamber 15 to the desired pressure.

Heater control subroutine 87 comprises program code for controlling the current to a heating unit that is used to heat the substrate. Heater control subroutine 87 is also invoked by chamber manager subroutine 77a and receives a target, or set-point, temperature parameter. Heater control subroutine 87 measures temperature by measuring voltage output of a thermocouple located in pedestal 12, comparing the measured temperature to the set-point temperature, and increasing or decreasing current applied to the heating unit to obtain the set-point temperature. The temperature is obtained from the measured voltage by looking up the corresponding temperature in a stored conversion table or by calculating the temperature using a fourth-order polynomial. When an embedded loop is used to heat pedestal 12, heater control subroutine 87 gradually controls a ramp up/down of current applied to the loop. Additionally, a built-in fail-safe mode can be included to detect process safety compliance, and can shut down operation of the heating unit if process chamber 15 is not configured properly.

Plasma control subroutine 90 comprises code for setting the low and high frequency RF power levels applied to the process electrodes in processing chamber 15, and for setting the low frequency RF frequency employed. Plasma control subroutine 90 also includes program code for turning on and setting/adjusting the power levels applied to the magnetron or other microwave source used in the present invention. Plasma control subroutine 90 is invoked by chamber manager subroutine 77a, in a fashion similar to the previously described chamber component subroutines.

The above description is mainly for illustrative purposes. Other equipment such as electron cyclotron resonance (ECR) plasma CVD systems, induction coupled RF high density plasma CVD systems, or the like may employ the present invention. Additionally, variations of the above-described system, such as variations in pedestal design, heater design, RF power frequencies, and location of RF power connections, as well as other alterations, are possible. For example, the substrate could be heated by quartz lamps. It should be recognized that the present invention is not necessarily limited to use with of any specific apparatus.

III. A Multi-Stage Cleaning Process According to the Present Invention

Figure 2:
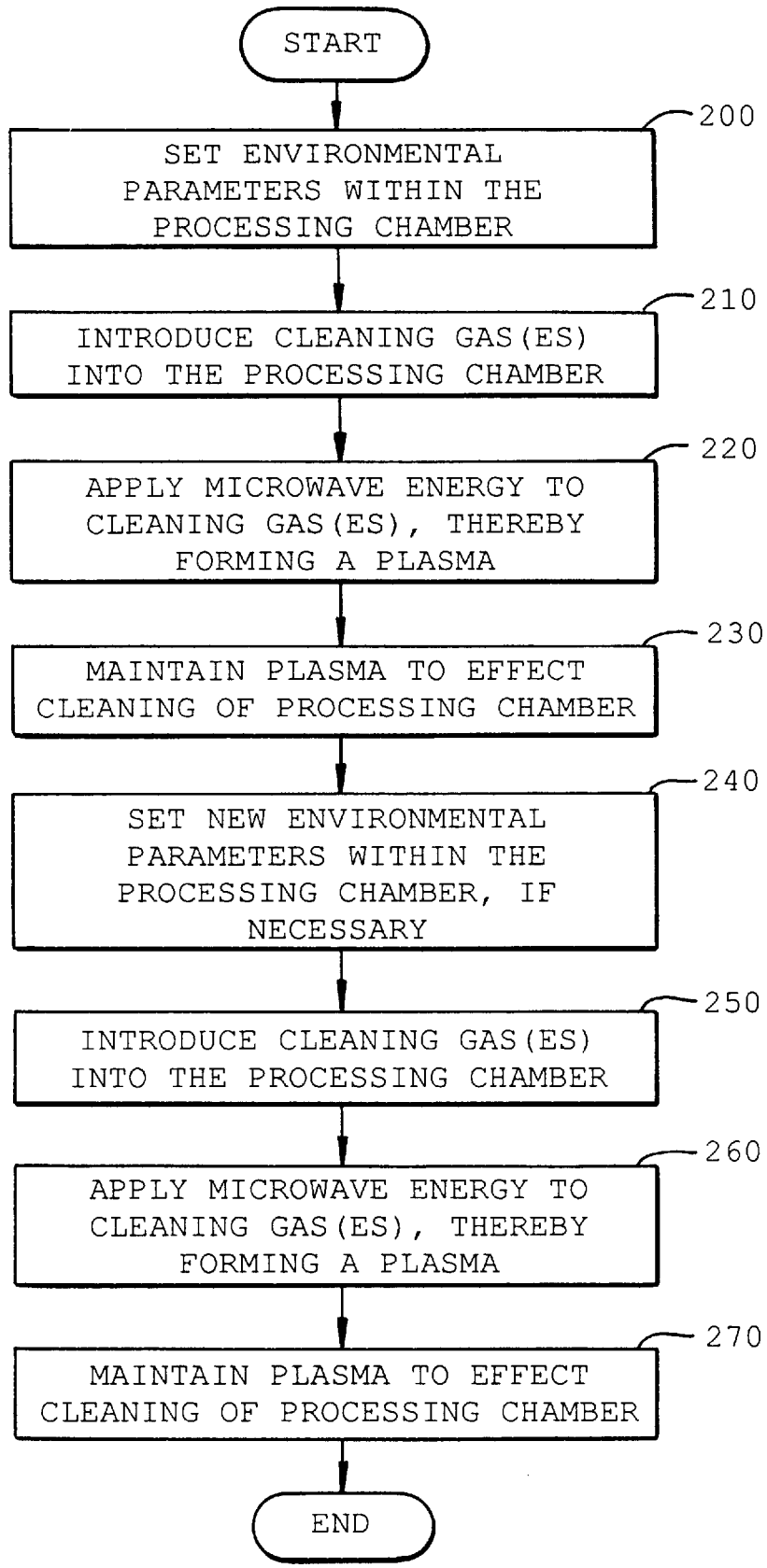
FIG. 2 is a flow diagram illustrating the steps performed in cleaning a processing chamber according to one aspect of the method of the present invention.

FIG. 2 illustrates generally the method of the present invention. For simplicity, the steps shown in FIG. 2 describe only a two-stage implementation of the method of the present invention. As previously noted, additional stages could be added by repeating either of the cleaning stages shown in FIG. 2. This might be done, for example, to provide cleaning of surfaces not cleaned by the first two stages, if necessary. Alternatively, this might be done to provide increasingly finer control over the etch rate, while maintaining maximum throughput and minimizing over-etching, also as previously noted. Of course, other methodologies comprehended by the method of the present invention are represented by the multi-stage cleaning process shown (e.g., alternating the first and second cleaning stages). For example, an optional step in which an inert gas such as argon is flowed through the chamber prior to flowing any other cleaning gases, in order to flush loose particles from the processing chamber, may be added.

The first stage of cleaning begins at step 200, during which environmental parameters within the processing chamber are established. This includes stabilizing the temperature and pressure in processing chamber 15. Next, a reactive gas is introduced into processing chamber 15 at step 210. The reactive gas in one embodiment is preferably $NF_3$, but other fluorine-containing gases such as carbon tetrafluoride ($CF_4$) or sulfur hexafluoride ($SF_6$) also may be used. Moreover, chlorine- or other halogen-containing gases may also be used as the reactive gas in other embodiments of the present invention in place of the fluorine-containing gas. In order to strike a plasma, microwave energy is then applied to the reactive gas at step 220. This plasma may be maintained between steps, or may be extinguished and subsequently re-ignited, depending on the specific embodiment of the present invention used. It should also be noted that if the reactive halogen radicals are generated remotely, the steps shown in FIG. 2 would be slightly altered. For example, in addition to forming the plasma, the reactive halogen radicals thus generated would need to be transferred into processing chamber 15.

At step 230, the plasma formed from the reactive gas is maintained for a period of time, allowing reactive radicals thus generated to react with residues on the interior surfaces of processing chamber 15 during that period. If a remote process is employed, the maintenance of the plasma equates to the maintaining the flow of radicals into processing chamber 15. During step 230, a vacuum pump system exhausts reaction by-products and unreacted cleaning gases via exhaust plenum 17 from processing chamber 15 into a gas passage 23 and out an exhaust line, with the pressure at which the gases and by-products are released through the exhaust line controlled by a throttle valve and the vacuum pump system.

This first stage of the cleaning process provides uniform cleaning of the interior surfaces of processing chamber 15 at the cleaning process' maximum etch rate (or, at least, a relatively high etch rate). This is because this cleaning stage uses the maximum concentration of halogen radicals that the microwave plasma generation system (whether in situ or remote) is capable of delivering (i.e., the halogen radicals are not diluted in any way). Thus, the bulk of the accumulated residues are removed by this portion of the cleaning process (regardless of where this cleaning stage occurs in the process). While this cleaning stage removes residue at the fastest possible rate, it is also the most difficult to accurately control and the most corrosive to the chamber's interior surfaces.

When ample residue remains, this relatively high etch rate is advantageous because the relatively thick residues may be removed quickly. However, if little residue remains, such etch rates can make accurate control over the cleaning process problematic. For example, if all the interior surfaces of a processing chamber have a uniform residue of at least a minimum thickness, the first cleaning stage of the present invention would be used to uniformly remove that minimum thickness from all the chamber's interior surfaces. This would remove the maximum amount of residue from all such surfaces in the processing chamber without etching the surface of any of the processing chamber's components. However, residues would still remain on those surfaces having a residue thickness greater than the minimum thickness. It is this remaining residue that the second (or third or subsequent) cleaning stages is to remove.

Due to its use of a microwave plasma in the generation of halogen radicals, the method of the present invention also provides the benefits of highly efficient radical generation. These include more complete cleaning of the processing chamber's interior surfaces and faster cleaning (due to the increased etch rate a high radical concentration provides). For example, if a fluorine-containing compound is used in cleaning the processing chamber's interior after a tungsten silicide deposition process is performed therein, the reactions between the residues and the fluorine radicals generated would include:

$$F^* + W \rightarrow WF \qquad (1)$$

$$F^* + Si \rightarrow SiF \qquad (2)$$

These by-products are exhausted from processing chamber 15 by the flow of gases through the system during the cleaning process (i.e., during step 230).

However, as well as this first cleaning stage performs, residues may (and indeed, likely will) remain on certain of the processing chamber's interior surfaces. This is particularly true in the cold-wall systems described previously. As noted, the rate at which the cleaning (i.e., etching) reactions occur depends, at least in part, on the temperature of the surface being cleaned. The hotter the surface, the faster the reactions proceed. Conversely, the cleaning reactions will proceed more slowly on a surface having a relatively low temperature. As also noted, such differences in temperature often lead to the uneven cleaning of a processing chamber's interior surfaces. Because surface temperatures often vary widely throughout a processing chamber's interior (especially in cold-walled systems), cleaning systems of the prior art may be forced to either leave some surfaces uncleaned or over-etch others. The method of the present invention addresses this limitation by providing one or more additional cleaning stages which more completely clean surfaces not sufficiently cleaned during the first stage while causing minimal over-etching (e.g., relatively cold surfaces).

FIG. 2 thus illustrates a cleaning process in which a second stage of cleaning is performed. As noted, the second stage of FIG. 2 allows the first cleaning stage to partially clean some or all of the processing chamber's interior surfaces because later cleaning stage(s) are available to remove the residues remaining. The additional cleaning step then cleans those surfaces not completely cleaned by the first step. Alternatively, several more cleaning stages could easily be added to the process shown in FIG. 2 while remaining within the intent of the method of the present invention. Generally, subsequent cleaning stages will introduce the inert gas(es) in increasing amounts. This might be done to provide increasingly finer control of the etch rate while maintaining maximum throughput by starting with a high etch rate (yielding high throughput, but poor control of the amount of residue removed) and performing one or more intermediate cleaning stages at decreased etch rates (using varying amounts of inert gas), working down to a low etch rate at a point where little residue remained (providing finer control over the amount of material etched away at a point at which the risk of over-etching was greatest). As less and less residue remains on a surface, then, the etch rate is reduced by providing an increased flow of inert gas. Ideally, the accuracy provided by the reduced etch rate allows the complete removal of the remaining residue without any etching of the processing chamber's interior in the least amount of time. Practically, if more accurate etching becomes necessary (i.e., the residue becomes so thin the cleaning process becomes difficult to accurately control using a given etching rate (inert gas flow)), another cleaning stage may be employed. The number of cleaning stages is only limited by throughput considerations and the fact that certain areas will be completely cleaned before others, and will experience some over-etching which should be minimized.

As illustrated by FIG. 2, this second cleaning stage begins by establishing new process parameters at step 240. Although step 240 is optional (because the process parameters chosen in step 200 may be acceptable for the entire cleaning process), various chamber parameters may require at least small adjustments, or new chamber parameters may be chosen to promote the cleaning of specific surfaces in processing chamber 15. For example, the spacing between pedestal 12 and gas distribution faceplate 13*a* can be varied to alter the etch rate experienced by portions of pedestal 12. Parameters relating to the cleaning gases employed are not included in these parameters, and will, of course, change between cleaning stages.

At step 250, one or more cleaning gases are introduced into processing chamber 15. These cleaning gases preferably include a reactive gas and an inert gas. The reactive gas will most likely be the one used in the first stage of the process, but a different halogen-containing compound may be employed, if desired. Argon or nitrogen may serve as the inert gas, although other inert gases may be employed with equal success. The ratio of inert gas to reactive gas may be any value that provides fast cleaning while minimizing over-etching. However, this value will likely depend on the gases used, the number of cleaning stages, the need for throughput, the need to minimize damage to the processing chamber, and the reactivity of the residue and the chamber's materials with the reactive gas(es), among other factors. The ratio may be in terms of flow rate, weight, or any other measure. For example, in a process cleaning WSix from aluminum (Al) in two stages using $NF_3$ and Ar, the first cleaning stage might use pure $NF_3$ and the second might use a 10:1 ratio (Ar:$NF_3$). Alternatively, this scenario might use three cleaning stages, in which the first might use a 3:1 ratio, the second, a 10:1 ratio, and the third, a ratio of 20:1. Again, these are only examples, and the ratios actually used will vary depending on numerous factors.

The inert gas is used to dilute the fluorine radicals to control the etch rate, thus allowing the use of the maximum feasible etch rate, given the amount of residue remaining (i.e., the level of accuracy needed with regard to the amount of etching to be performed) and the need to remove the remaining residues as quickly as possible without over-etching. The amount of accuracy necessary in controlling the etch rate is driven by the need to balance fast cleaning of the process chamber against accurately controlling the etching performed (to avoid over-etching, and the wear and down-time that implies). In addition to allowing control over the etch rate, the inclusion of an inert gas also maintains (or increases) total gaseous flow, improving the distribution of the reactive radicals. This improved distribution provides more complete and uniform cleaning of processing chamber 15, which is especially important in the case of low radical concentrations.

Next, microwave energy is applied to the cleaning gases in order to strike a plasma at step 260. Alternatively, the plasma may be formed from the reactive gas and the inert gas subsequently mixed into the stream of fluorine radicals thus generated. At step 270, the plasma formed from the cleaning gases is maintained for a period of time, allowing the reactive radicals thus generated to react with residues on the interior surfaces of processing chamber 15 during that period. If a remote process is employed, the maintenance of the plasma equates to the maintaining the flow of radicals into processing chamber 15. As before, the exhaust system removes reaction by-products and unreacted cleaning gases from processing chamber 15 via the exhaust line.

In the method illustrated in FIG. 2, because the halogen radicals react with residues identical with those removed in the first cleaning stage, the equations in the second cleaning stage are identical to Equations 1 and 2 from the first cleaning stage, assuming the same halogen-containing compound is employed. However, the rate at which the reactive radicals etch the interior surfaces of processing chamber 15 depends upon the concentration of reactive radicals, the substance with which these radicals react, and the temperature at which the reaction occurs, among other factors. As noted, the hotter the surface, the faster the reaction will proceed and the higher the etch rate. An increase in the concentration of reactive radicals will also increase the etch rate. This is not a proportional effect, however, if different substances are being etched. First, different compounds can etch at different rates, all other variables being held constant. Moreover, the etch rates of different materials can change at different rates with changes in temperature, reactive radical concentration, and other factors. For example, in a cleaning process that uses fluorine radicals to remove tungsten silicide residues, reducing the fluorine radical concentration reduces the etch rate of aluminum components (e.g., certain of a chamber's interior surfaces) more than the etch rate of the tungsten silicide residues. Thus, an added benefit of the present invention is the ability to minimize over-etching of interior chamber surfaces while continuing to clean the remaining residues (e.g., those residues remaining after the first cleaning stage).

As noted, the flow diagram of FIG. 2 is only an example of the method of the present invention, and may be altered while remaining within the intent of the present invention. For example, the order illustrated in FIG. 2 may be reversed. In that case, surfaces originally cleaned by the second stage are cleaned first, and those originally cleaned by the first stage cleaned subsequently. However, when the cleaning stages are reversed from the order shown in FIG. 2, the chamber parameters used in the cleaning process may need to be adjusted to take account of this fact, because each cleaning stage exhibits different cleaning characteristics.

Such adjustments might be minor, such as altering the ratio of inert gas to the halogen-containing cleaning gas. A more profound change would be the use of jets of the inert gas to reduce etching in certain areas, or the use of jets of the halogen-containing cleaning gas to increase etching in certain areas (or a combination thereof).

Other changes to the process of FIG. 2 might include the introduction of one or more inert gases in the first cleaning stage. In this case, the cleaning process simply becomes two or more iterations of the second cleaning stage. For example, if two cleaning stages were performed, each mixing an inert gas with the radicals generated, different ratios could be used in each stage to maximize throughput while minimizing over-etching, as noted.

The method according to the present invention illustrated in FIG. 2 has been described with reference to an in situ microwave plasma generation technique. However, the microwave plasma may be generated remotely using an apparatus such as that described in Kao. In Kao, the reactive gas is input via a gas inlet into a plasma applicator (basically, a microwave cavity) where microwaves transmitted via a waveguide system from a microwave source form standing waves. The standing waves in the plasma applicator ignite and maintain a plasma from the cleaning gases. The reactive radicals thus generated are discharged from the plasma applicator through an outlet and transported downstream for use in cleaning a processing chamber (e.g., processing chamber 15) of a substrate processing apparatus (e.g., CVD system 10). The use of a remote microwave plasma generation technique provides the added benefits of reduced wear on process kit components and allowing the simple modification of systems of the prior art to allow them to take advantage of the cleaning techniques of the present invention. As noted, the inert gas may be introduced in the microwave plasma, or may be introduced into the flow of reactive radicals, downstream of the plasma.

The chamber parameters used in a cleaning process according to the method of the present invention may vary widely while still providing acceptable cleaning of processing chamber 15, but certain ranges provide particularly efficient and complete cleaning of the chamber's interior surfaces. For example, when using $NF_3$ in the first cleaning stage (i.e., steps 200–230 of FIG. 2), the $NF_3$ is preferably introduced at a flow rate ranging between about 50 standard cubic centimeters per minute (sccm) and 1000 sccm, and most preferably at about 300 sccm in a specific embodiment. This flow rate may be employed in either an in situ or remote microwave plasma generation technique, as may the other chamber parameters described herein. With process chamber 15 (or the plasma applicator) preferably maintained at a pressure ranging from about 1 millitorr (mT) to 20 torr (T), and most preferably at about 1 T in a specific embodiment, a plasma may be struck and sustained in the reactive gas using between about 300 W and 3000 W from the microwave power source, and most preferably using 500 W. Preferably, a microwave frequency of 2450 MHz is used to strike and maintain the microwave plasma during this stage, although other microwave frequencies may be preferable in other embodiments. The temperature of pedestal 12 (the heater) is preferably maintained between about 400° C. and 700° C., and is most preferably about 550° C. This is another advantage of the present invention, in that the temperature need not be lowered to avoid over-etching of the chamber's components, as in the prior art. This improves throughput by avoiding the delays involved in cooling and heating the chamber's components. The plasma is preferably maintained during this first cleaning stage for between about 10 seconds and 1000 seconds, and is most preferably maintained for a period of about 300 seconds. The first stage may be discontinued by either extinguishing the plasma, or by altering the cleaning gas(es) and/or chamber parameters (i.e., simply starting the second cleaning stage). Optionally, an inert gas such as argon may be introduced at a flow rate of up to 5000 sccm to control the etch rate of the cleaning process and/or the surfaces thus cleaned.

The second stage illustrated in FIG. 2 (i.e., steps 240–270) employs chamber parameters similar to those used in the first cleaning stage. Again, the stated flow rates, temperatures, pressures, and other chamber parameters may be employed with either an in situ or remote microwave plasma generation technique, as before. When using $NF_3$ in the second cleaning stage, the $NF_3$ is preferably introduced at a flow rate ranging between about 50 sccm and 1000 sccm, and most preferably at about 300 sccm in a specific embodiment. In this cleaning stage, argon is also introduced into processing chamber 15 (or the plasma applicator, although the inert gas used in this stage may be introduced into the processing chamber even when a remote plasma generation system is employed). Argon is preferably introduced at a flow rate ranging between about 50 sccm and 5000 sccm, and most preferably at about 500 sccm in a specific embodiment. With process chamber 15 (or the plasma applicator) preferably maintained at a pressure ranging from about 1 mT to 20 T, and most preferably at about 1 T in a specific embodiment, a plasma may be struck and sustained in the reactive gas using between about 300 W and 3000 W from the microwave power source, and most preferably using 500 W. Again, a microwave frequency of 2450 MHz is preferably used to strike and maintain the microwave plasma during this stage, although other microwave frequencies may be preferable in other embodiments. The heater temperature is preferably maintained between about 400° C. and 700° C., and is most preferably about 550° C. The plasma is preferably maintained during this second cleaning stage for between about 10 seconds and 1000 seconds, and is most preferably maintained for a period of about 300 seconds.

A number of different microwave power supplies are capable of generating microwave energy in the aforementioned ranges. For example, an inexpensive pulsed, low-wattage power supply is capable of generating between about 1.0 kW and 1.5 kW of microwave power. Alternatively, a high-wattage, continuous-wave (CW) power supply may be employed to generate the requisite microwave energy. Such systems can typically provide between about 2.5 kW and 6 kW of microwave power. In some preferred embodiments, the microwave power supply may be of the type employed in certain microwave ovens and be powered by a low-cost, low-wattage, pulsed 60 Hertz (Hz) half-rectified power source, providing microwaves preferably having a frequency of about 2450 MHz. Such pulsed, low-wattage microwave generators can be at least two orders of magnitude lower in price than a high power CW microwave generator or an RF generator. In other preferred embodiments the microwave power supply is a CW microwave source providing microwaves at about 2.45 GHz and between about 300 W and 6 kW.

The above-described gas flows, chamber pressures, temperature ranges, and other chamber parameters provide for cleaning procedures that are sufficient to remove undesired residues such as the tungsten and silicon residues that may accumulate over time after processing multiple substrates in a tungsten silicide deposition process. The parameters in the above cleaning processes should not be considered limiting to the claims. Other oxide, nitride, or metal-containing residues may be cleaned using the present invention in substrate processing apparatus depositing other types of films besides tungsten silicide. The actual values (temperature, pressure, gas flows, etc.) selected for a particular cleaning recipe will vary according to various applications. Also, flow values mentioned above are for a DCSxZ chamber (equipped for a 200-mm substrate and with a total volume of about 7 liters) manufactured by Applied Materials, Inc. Flow values may differ depending on the type or size of chamber used. Additionally, the usefulness of the present invention is demonstrated for cleaning of CVD apparatus using $NF_3$ as an exemplary reactive gas. However, other halogen-containing gases such as $CF_4$ and $ClF_3$ may also be used. One of ordinary skill in the art may also use other chemicals, chamber parameters, and conditions for cleaning with the present invention.

A cleaning processing according to the method of the present invention offers several advantages over the prior art. Most importantly, such a cleaning process allows cleaning to occur as quickly as possible while etching processing chamber components as little as possible. Another benefit of the present invention is the uniform cleaning provided, even if the residues being removed are not deposited uniformly (a common situation). This cleaning method thus provides for more complete cleaning of the processing chamber. Finally, the improved cleaning offered by the present invention reduces downtime by reducing etching of processing chamber components and increasing the number of depositions which may be performed between wet cleans.

It is to be understood that the above description is intended to be illustrative and not restrictive. Many embodiments will be apparent to those of skill in the art upon reviewing the above description. By way of example, the inventions herein have been illustrated primarily with regard to an in situ cleaning process, but they are not so limited. Those skilled in the art will recognize other equivalent or alternative methods of cleaning a substrate processing chamber while remaining within the scope of the claims of the present invention. Although the above description discusses $NF_3$ in particular, other reactive gases including dilute $F_2$, $CF_4$, $C_2F_6$, $C_3F_8$, $SF_6$, or $ClF_3$ may used for cleaning substrate processing systems used to deposit tungsten silicide residue, or other undesired residues depending on the specific substrate process used in the system. Such cleaning gases could also be used to remove oxygen-containing and other compounds. Further, inert gases other than argon may be used, such as nitrogen, helium, and others. Although the above-described embodiments provide excitation using a single mode of resonance, other embodiments may take advantage of multimode resonance or use other frequencies besides about 2.45 GHz. In addition to being used with CVD chambers, the cleaning method described above may be used with etch chambers, physical vapor deposition (PVD) chambers, or other chambers. The scope of the inventions should, therefore, be determined not with reference to the above description, but should instead be determined with reference to the appended claims, along with the full scope of equivalents to which such claims are entitled.

What is claimed is:

1. A method for removing residue from an interior surface of a substrate processing chamber, said method comprising:
performing a plurality of cleaning stages, each one of said plurality of cleaning stages comprising:
generating reactive halogen radicals by dissociating a halogen-containing gas using microwave energy,
forming a gaseous cleaning mixture by mixing said reactive halogen radicals with an inert gas in a mixing ratio, and
reacting a portion of said reactive halogen radicals with a portion of a residue accumulated on an interior surface of the substrate processing chamber to remove said portion of said residue, wherein said mixing ratio is equal to a first mixing ratio during one of said plurality of cleaning stages and said mixing ratio is equal to a second mixing ratio during another of said plurality of cleaning stages, said first and said second mixing ratios being different.

2. The method of claim 1, wherein said mixing ratio decreases monotonically with said each one of said plurality of cleaning stages.

3. The method of claim 1, wherein said halogen-containing gas is a first halogen-containing gas during a first one of said cleaning stages and a second halogen-containing gas during a subsequent one of said cleaning stages.

4. The method of claim 1, wherein said cleaning step is performed at a temperature of between about 400° C. and 700° C.

5. The method of claim 1, wherein said cleaning step is performed at a cleaning temperature, said cleaning temperature being substantially equal to a temperature at which a substrate is processed in the substrate processing chamber.

6. The method of claim 1, wherein said microwave energy creates a plasma from said halogen-containing gas.

7. The method of claim 6, wherein said forming step is performed by introducing said inert gas into said plasma, such that said inert gas becomes part of said plasma.

8. The method of claim 1, wherein said forming a gaseous cleaning mixture is performed by introducing said inert gas into said plasma, such that said inert gas becomes part of said plasma.

9. The method of claim 1, wherein said forming a gaseous cleaning mixture is performed by introducing said inert gas into said reactive halogen radicals prior to introducing said gaseous cleaning mixture into the substrate processing chamber.

10. The method of claim 1, wherein said forming a gaseous cleaning mixture is performed by introducing said inert gas into said reactive halogen radicals within the substrate processing chamber.

11. The method of claim 1, wherein said microwave energy is at a frequency of about 2450 MHz.

12. The method of claim 1, wherein said halogen-containing gas is a fluorine-containing gas.

13. The method of claim 1, wherein said microwave energy is applied for a period of time between about 10 seconds and 1000 seconds during each one of said cleaning stages.

14. The method of claim 1, wherein said microwave energy is between about 300 W and 3000 W.

15. The method of claim 1, wherein said mixing ratio is a ratio of a flow rate of said inert gas to a flow rate of said halogen-containing gas.

16. The method of claim 15, wherein said first mixing ratio is such that said flow rate of said inert gas is zero.

17. The method of claim 15, wherein said flow rate of said halogen-containing gas is between about 50 sccm and 1000 sccm.

18. The method of claim 15, wherein said flow rate of said inert gas is between about 0 sccm and 5000 sccm during a first one of said plurality of cleaning stages, and is between about 50 sccm and 5000 sccm during a second one of said plurality of cleaning stages.

19. The method of claim 15, wherein said mixing ratio is between about 0:1 and 100:1 during a first one of said plurality of cleaning stages, and is between about 0.05:1 and 10:1 during a second one of said plurality of cleaning stages.

20. A substrate processing system comprising:

a housing forming a chamber;

a remote microwave plasma system fluidly coupled to said chamber;

a gas distribution system fluidly coupled to said chamber;

a controller for controlling said gas distribution system and said remote microwave energy application system; and a memory coupled to said controller comprising a computer readable medium having a computer readable program embodied therein for directing operation of said substrate processing system to perform a cleaning process to clean an interior surface of said chamber, said computer readable program comprising computer instructions to control said substrate processing system to perform a chamber clean process including a plurality of clean stages, wherein for each of said plurality of clean stages said computer readable program includes:

computer instructions for controlling said gas distribution system to flow a halogen-containing gas into said remote microwave plasma system;

computer instructions for controlling said remote microwave plasma system to form a plasma from said halogen-containing gas, said plasma including reactive halogen radicals; and computer instructions for controlling said gas distribution system to form a gaseous cleaning mixture within said chamber by combining a flow of an inert gas with said reactive halogen radicals in a mixing ratio, wherein said mixing ratio is equal to a first mixing ratio during one of said plurality of cleaning stages and said mixing ratio is equal to a second mixing ratio during another of said plurality of cleaning stages, said first and said second mixing ratios being different.

21. The system of claim 20 wherein said computer instructions for controlling said gas distribution system form said gaseous cleaning mixture form said mixture so that said mixing ratio decreases monotonically with said each one of said plurality of cleaning stages.

22. The system of claim 20 wherein said computer instructions for controlling said gas distribution system to flow said halogen-containing gas into said remote microwave plasma system flow a first halogen-containing gas during a first one of said cleaning stages and a second halogen-containing gas during a subsequent one of said cleaning stages.

23. A substrate processing system comprising:

a housing forming a chamber;

a microwave energy application system coupled to said chamber;

a gas distribution system fluidly coupled to said chamber;

a controller for controlling said gas distribution system and said remote microwave energy application system; and a memory coupled to said controller comprising a computer readable medium having a computer readable program embodied therein for directing operation of said substrate processing system to perform a cleaning process to clean an interior surface of said chamber, said computer readable program comprising computer instructions to control said substrate processing system to perform a chamber clean process including a plurality of clean stages, wherein for each of said plurality of clean stages said computer readable program includes:

computer instructions for controlling said gas distribution system to flow, during a first cleaning stage, a cleaning gas comprising a halogen-containing gas and an inert gas into said chamber, at a first mixing ratio;

computer instructions for controlling said gas distribution system to flow said cleaning gas into said chamber in a second mixing ratio during a second cleaning stage, said first and said second mixing ratios being different; and computer instructions for controlling said microwave system to form a plasma from said cleaning gas during said first and second cleaning stages, said plasma including reactive halogen radicals.

24. The system of claim 23 wherein said computer instructions for controlling said gas distribution system form said gaseous cleaning mixture form said mixture so that said mixing ratio decreases monotonically with said each one of said plurality of cleaning stages.

25. The method of claim 1 wherein said reactive halogen radicals are generated in a microwave cavity remote from said substrate processing chamber.

* * * * *